United States Patent [19]
Bockelman et al.

[11] Patent Number: 6,118,322
[45] Date of Patent: Sep. 12, 2000

[54] METHOD AND APPARATUS FOR REDUCING EVEN ORDER DISTORTION IN DIFFERENTIAL CIRCUITS

[75] Inventors: David E. Bockelman, Weston; Robert E. Stengel, Pompano Beach, both of Fla.

[73] Assignee: Motorola, Inc., Schaumburg, Ill.

[21] Appl. No.: 09/185,263

[22] Filed: Nov. 3, 1998

[51] Int. Cl.[7] .............................. H03K 5/08; H03L 5/00
[52] U.S. Cl. ............................................ 327/317; 327/313
[58] Field of Search .................................... 327/113, 317, 327/326; 330/301; 333/25

[56] References Cited

U.S. PATENT DOCUMENTS

| | | | |
|---|---|---|---|
| 3,761,831 | 9/1973 | Foerster | 330/69 |
| 5,613,233 | 3/1997 | Vagher | 455/296 |
| 5,949,821 | 9/1999 | Emami et al. | 375/235 |
| 6,009,317 | 12/1999 | Wynn | 455/296 |

OTHER PUBLICATIONS

"Analysis and Design of Analog Integrated Circuits" third edition, by Paul R. Gray and Robert G. Meyer, pp. 240–241 and 275–276.

*Primary Examiner*—Terry D. Cunningham
*Assistant Examiner*—Quan Tra
*Attorney, Agent, or Firm*—Andrew S. Fuller

[57] ABSTRACT

An apparatus (100) includes a differential processing circuit (135) responsive to an input signal with first and second signal components, and a signal imbalance suppressor (130) that preprocesses the input signal, prior to input to the differential processing circuit, to remove amplitude and/or phase imbalances that exist between the first and second signal components, in order to reduce even order distortion generation within the differential processing circuit.

14 Claims, 5 Drawing Sheets

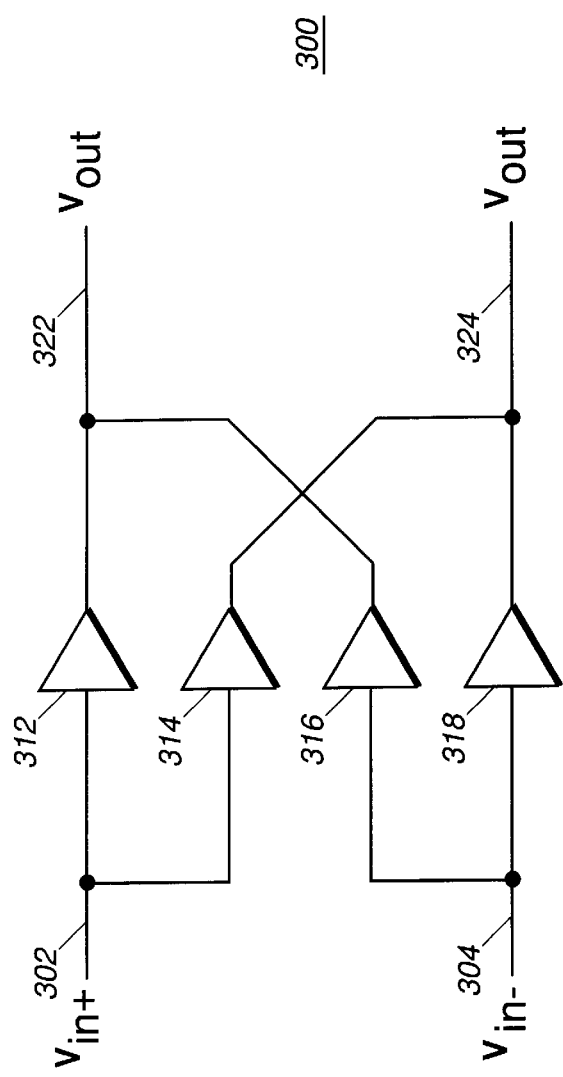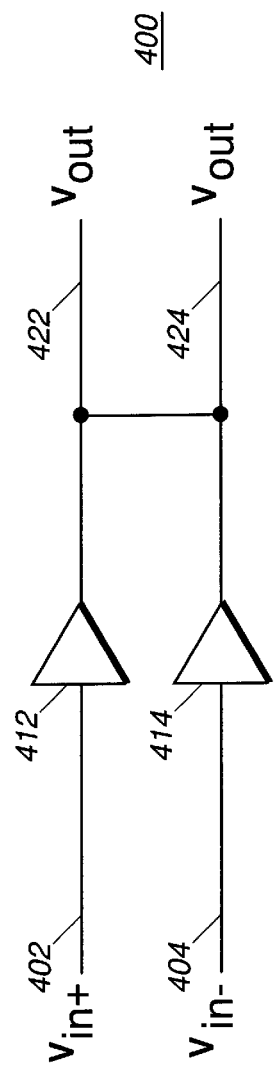
FIG. 3
FIG. 4

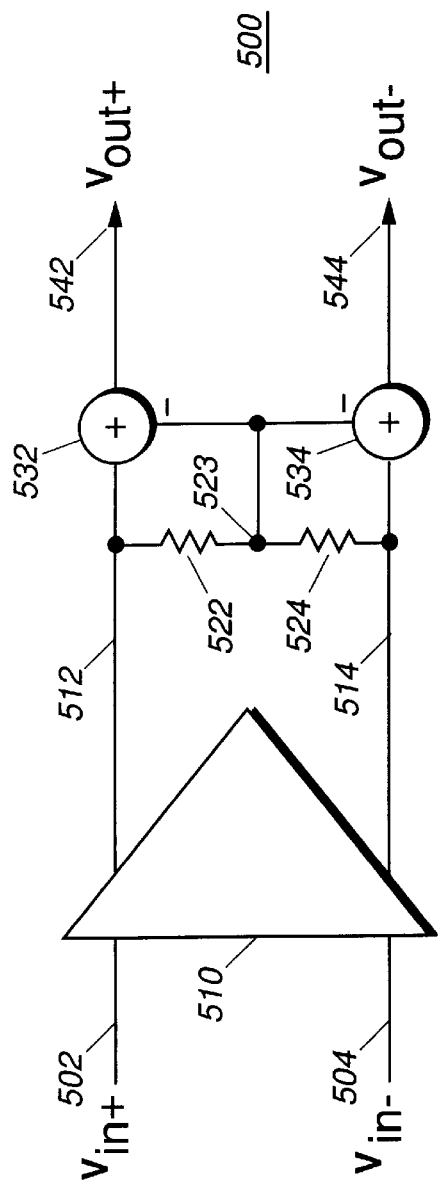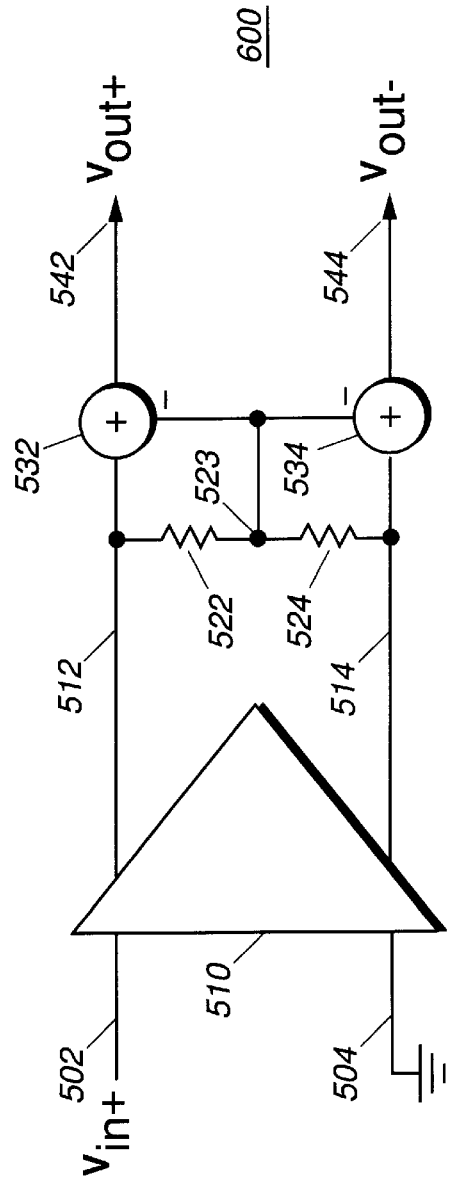

METHOD AND APPARATUS FOR REDUCING EVEN ORDER DISTORTION IN DIFFERENTIAL CIRCUITS

TECHNICAL FIELD

This invention relates in general to differential circuits, and more particularly, to reducing even-order distortion in differential signals.

BACKGROUND OF THE INVENTION

Communication products such as radio telephones and the like often use differential circuits to enhance signal processing capabilities. Differential circuits are generally less susceptible to external interference than single-ended circuits, and are used for such applications as direct conversion receivers and direct launch transmitters, which are gaining in popularity. However, a major problem hindering the use of differential circuits in direct conversion receivers is that of even order distortion. As an example of even order distortion, if two signals are introduced to a circuit with the two signals being at different frequencies separated by some difference frequency (Δf), a third undesired signal is generated at the output at a frequency of Δf. For instance, if the two input signals are at 100 megahertz (MHz) and 101 MHz, then the undesired signal would be at 1 MHz. In the case of a direct conversion receiver, if the undesired signal at 1 MHz falls in the desired output frequency band, it would create an undesired response in the receiver output circuitry.

In a typical direct conversion receiver, a received radio frequency signal is converted to differential signals that are mixed with injection signals to achieve particular phase and amplitude separation characteristics. Ideally, the mixer circuitry is arranged to process the resultant differential signal in a balanced manner. However, when the mixer circuitry is not ideal, i.e., when there are imbalances in the circuitry, secondary nonlinear responses are formed which result in even order distortion.

Much effort has been expended in circuit design in an attempt to reduce even order distortion, such as second order intermodulation distortion. One prior art solution is to use high-quality components and robust manufacturing techniques to ensure balanced differential processing circuits. This approach can add significant cost to a product. Another approach is to incorporate feedback circuitry that detects imbalances and provide for corrective action to eliminate or reduce the effects of the imbalances. One problem with this approach is that imbalances may not be detected until there is an adverse impact on the differential processing circuit. Moreover, errors induced by imbalances may not be detectable at the output of a differential processing circuit.

It is desirable to reduce the even order distortion performance of differential circuits, for such applications as direct conversion receivers. Circuit techniques employed in the art do not adequately address even order distortion present in differential circuits. Accordingly, a new approach is needed to reduce even order distortion.

BRIEF DESCRIPTION OF THE DRAWINGS

FIG. 3 is a circuit diagram of a differential mode suppressor, in accordance with the present invention.

FIG. 4 is a second embodiment of the differential mode suppressor, in accordance with the present invention.

FIG. 5 is an alternative embodiment of the signal imbalance suppressor, in accordance with the present invention.

FIG. 6 is a circuit diagram of a balun, in accordance with the present invention.

DETAILED DESCRIPTION OF THE PREFERRED EMBODIMENT

Figure 1:
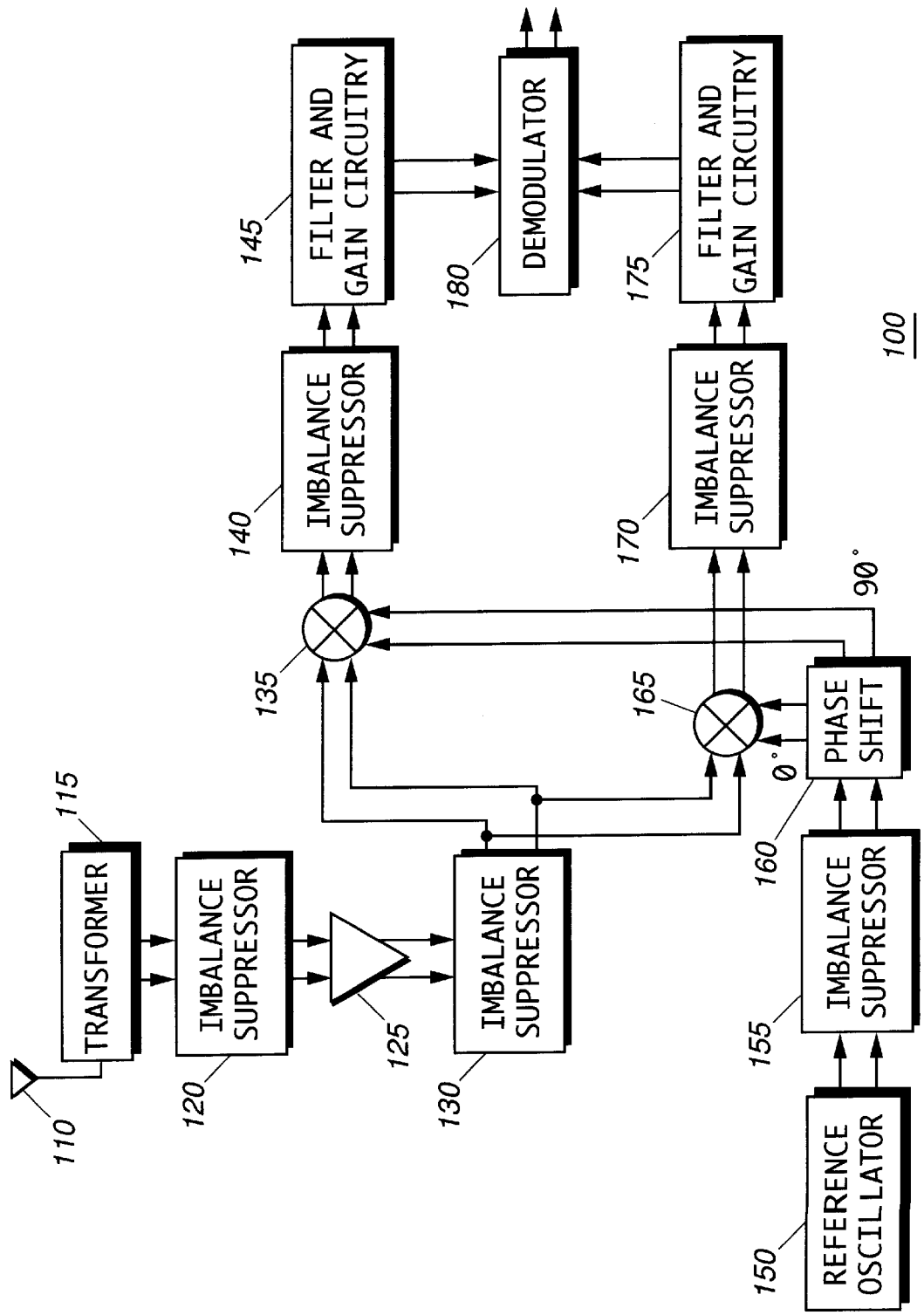
FIG. 1 is a block diagram of a direct conversion receiver incorporating signal imbalance suppression, in accordance with the present invention.

While the specification concludes with claims defining the features of the invention that are regarded as novel, it is believed that the invention will be better understood from a consideration of the following description in conjunction with the drawing figures, in which like reference numerals are carried forward.

The present invention provides for the reduction of even order distortion, such as to facilitate the processing of differential signals. The inventors have discovered that a significant source of even order distortion (such as second order intermodulation distortion) is caused by imbalances in the input differential signal to a differential processing circuit, i.e., amplitude and/or phase imbalances that exist between signal components of the differential input signal. Even order distortion may occur even if a perfectly balanced differential processing circuit is used to process an unbalanced differential signal. After differential processing, such imbalances in the input signal may result in a pure differential mode distortion component as well as a pure common mode distortion component. Correction circuits that rely on detection of the common mode distortion component in the output signal to provide a feedback signal to improve imbalances in a differential processing circuit are ineffective to correct for the pure differential mode distortion component caused by input signal imbalances.

According to the invention, an unbalanced differential input signal destined for a differential processing circuit is preprocessed to remove imbalances in the signal, in order to reduce even order distortion generation within the differential processing circuit. Preferably, the pure differential mode signal component of the unbalanced differential signal is suppressed to obtain a common mode signal, which is then subtracted from, or otherwise combined with, the original unbalanced differential signal to obtain a balanced differential signal. This technique ensures that a differential processing circuit operates on the balanced differential signal, thereby reducing the potential for even order distortion. In another embodiment of the present invention, the balancing circuitry is used in the formation of a balun.

FIG. 1 shows a direct conversion receiver that incorporates differential signal processing, in accordance with the present invention. An antenna 110 provides a single-ended communication signal to a transformer 115 for conversion into differential signals. The output of the transformer 115 is presented as an input to an amplifier 125. Output signals from the amplifier 125 are coupled to mixers 135, 165. The mixers 135, 165 are also provided with injection signals having a phase offset of 90 degrees, to separate inphase (I) and quadrature (Q) signal components. The injection signals are sourced from a reference oscillator 150 through a phase shift module 160 that provides the necessary phase offset.

According to the present invention, signal imbalance suppressors 120, 130, 140, 155, 170 are selectively integrated into the receiver circuitry to ensure that balanced differential signals are presented as inputs to the differential processing circuits, such as the mixers 135, 165, amplifier 125, and filter and gain circuitry 145, 175 shown. Thus, the signal imbalance suppressor 120 is interposed between the transformer 115 and the amplifier 125 and has a primary purpose to ensure that the amplifier 125 is presented with a balanced differential signal from the transformer 115. As an alternative, the signal imbalance suppressor 120 may be configured as a balun thereby obviating the need for the transformer 115. The signal imbalance suppressor 130 processes the input to the mixers 135, 165 to remove signal imbalances generated by the amplifier 125, and the signal imbalance suppressor 155 processes input signals destined for the phase shift module 160 to remove imbalances that may be present in the signal sourced from the reference oscillator 150, in a manner similar to that described above.

The output signal from each mixer 135, 165 is coupled to filter and gain circuitry 145, 175, and to a demodulator 180, which provides an output for further signal processing. Signal imbalance suppressors 140, 170 remove any imbalances caused by the mixer circuitry.

Figure 2:
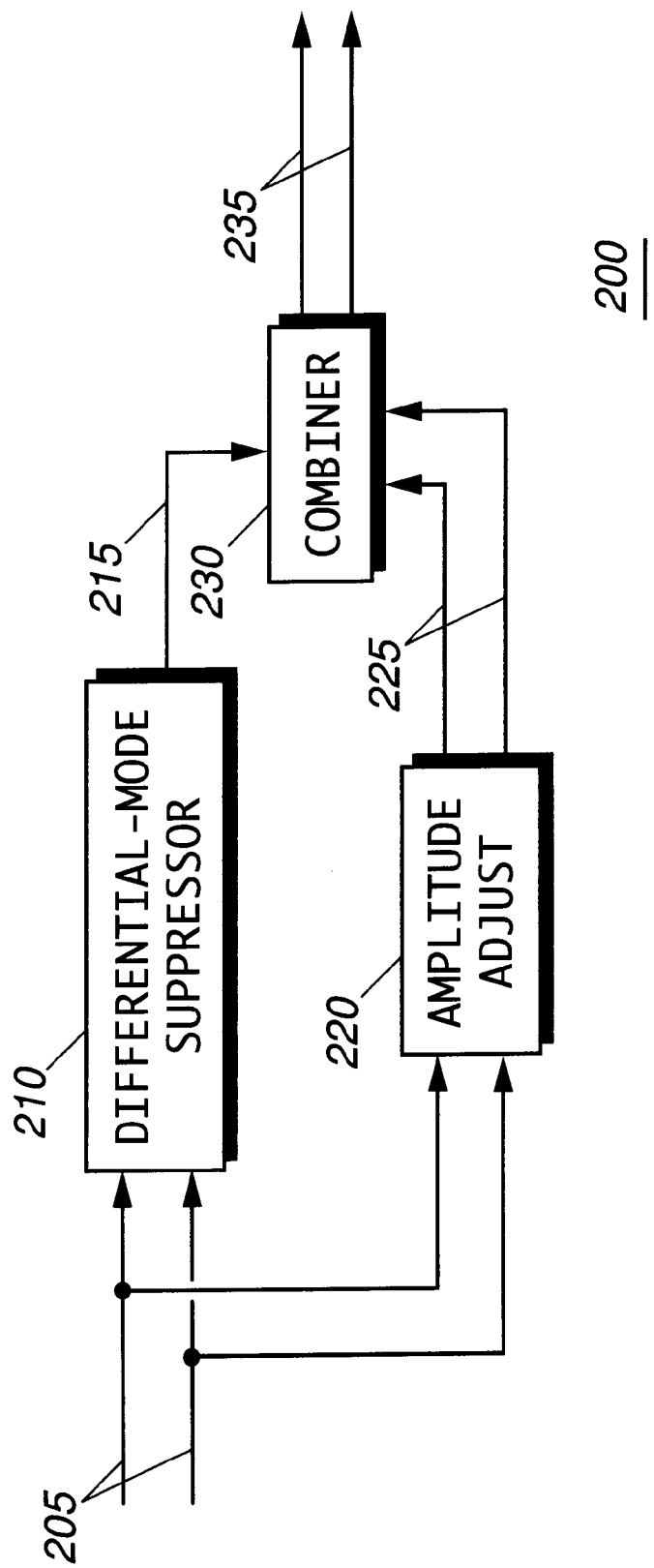
FIG. 2 is a block diagram of a signal imbalance suppressor, in accordance with the present invention.

FIG. 2 shows a block diagram 200 implementing one of the signal imbalance suppressors 120, 130, 140, 155, 170, described with respect to FIG. 1. A differential mode suppressor 210 is coupled to a differential input signal line 205 and has an output 215 of a common mode signal, representing the common mode signal component of an unbalanced differential signal presented on the differential input signal line 205. A combiner 230 coupled to the common mode signal and to the unbalanced differential signal, operates to subtract the common mode signal component 215 from the unbalanced differential signal 225 to yield a balanced differential signal 235. The amplitude of either of the common mode signal or the unbalanced differential signal is adjusted to ensure that the signals are of appropriate amplitudes before the subtraction. As shown, an amplitude adjuster module 220 is coupled to the differential input signal line 205 to adjust the amplitude of the unbalanced differential signal, and the output 225 of the amplitude adjuster module 220 coupled to the combiner 230. The combiner 230 has an output 235 of the balanced differential signal.

In FIG. 3, a circuit diagram of a first embodiment of the differential mode suppressor 300 is shown, in accordance with the present invention. A first input terminal 302 is coupled to first and second amplifiers 312, 314, and a second input terminal 304 is coupled to second and third amplifiers 316, 318. Outputs from the first and third amplifiers 312, 316 are short circuited to form a first output terminal 322, and outputs from the second and fourth amplifiers 314, 318 are short circuited to form a second output terminal 324. The first, second, third, and fourth amplifiers 312, 314, 316, 318 are responsive to an unbalanced differential signal presented at the first and second input terminals 302, 304, to generate the common mode signal component at the first and second output terminals 322, 324.

In FIG. 4, a circuit diagram of a second embodiment of the differential mode suppressor 400 is shown, in accordance with the present invention. A first input terminal 402 is coupled to a first amplifier 412, and a second input terminal 404 is coupled to a second amplifier 414. Outputs from the first and second amplifiers 412, 414 are short circuited to form first and second output terminals 422, 424. Thus, the first and second amplifiers 412, 414 are responsive to an unbalanced differential signal presented at the first and second input terminals 402, 404, to generate the common mode signal component at the first and second output terminals 422, 424. The amplifiers 412, 414 form isolation circuitry that provide isolation between the input terminals 402, 404 and the output terminals 422, 424, i.e., signals propagate from the input terminals to the output terminals, but not vice versa. Isolators may also be used to provide such isolation.

The signal imbalance suppression techniques of the present invention may be incorporated into a variety of circuit designs. One approach is to combine differential mode suppression with gain circuitry as shown in FIG. 5. Here, a circuit 500 includes a differential input port comprising two terminals 502, 504 provides an amplifier 510 with differential input signal components, Vin+, Vin−. The amplifier 510 has two output terminals 512, 514 bridged by two high impedance values resistors 522, 524 coupled in series and sharing a common node 523 therebetween. Summers 532, 534 have inputs coupled to the output terminals 512, 514, respectively, and both have an input coupled to the common node 523, and function to combine the inputs to generate outputs 542, 544 (Vout+, Vout−) for the imbalance suppressor designated. With this approach, the resistors on the output of the differential amplifier provided a common mode signal without significantly loading the amplifier. The original input signal, i.e., the combined differential and common mode signals, is amplified. The common mode signal provided is then subtracted from both outputs of the amplifier. As a result, a pure differential mode signal is formed at the output.

Many applications with differential circuits rely, at some point, on a single-ended to differential converter, i.e., balun, to generate differential signals. Baluns, whether passive or active, cause some degree of imbalance in the differential signal, which can be characterized by comparing the two constituent single-ended signals with the differential signal. The imbalance can be in both relative phase, i.e., deviation from 180 degrees, and relative magnitude, i.e., deviation from 0 dB ratio between the two constituent single-ended signals.

In FIG. 6, the signal imbalance suppression techniques of the present invention are applied to form a balun 600, i.e., circuitry that converts single-ended signals to differential signals. Here, the circuitry described in FIG. 5 is modified such that one of inputs is grounded as shown. This type of circuitry is particularly suitable for accurate differential conversion in an integrated circuit. Moreover, cascading several stages of imbalance suppressors further improves the balance of a differential signal.

Figure 7:
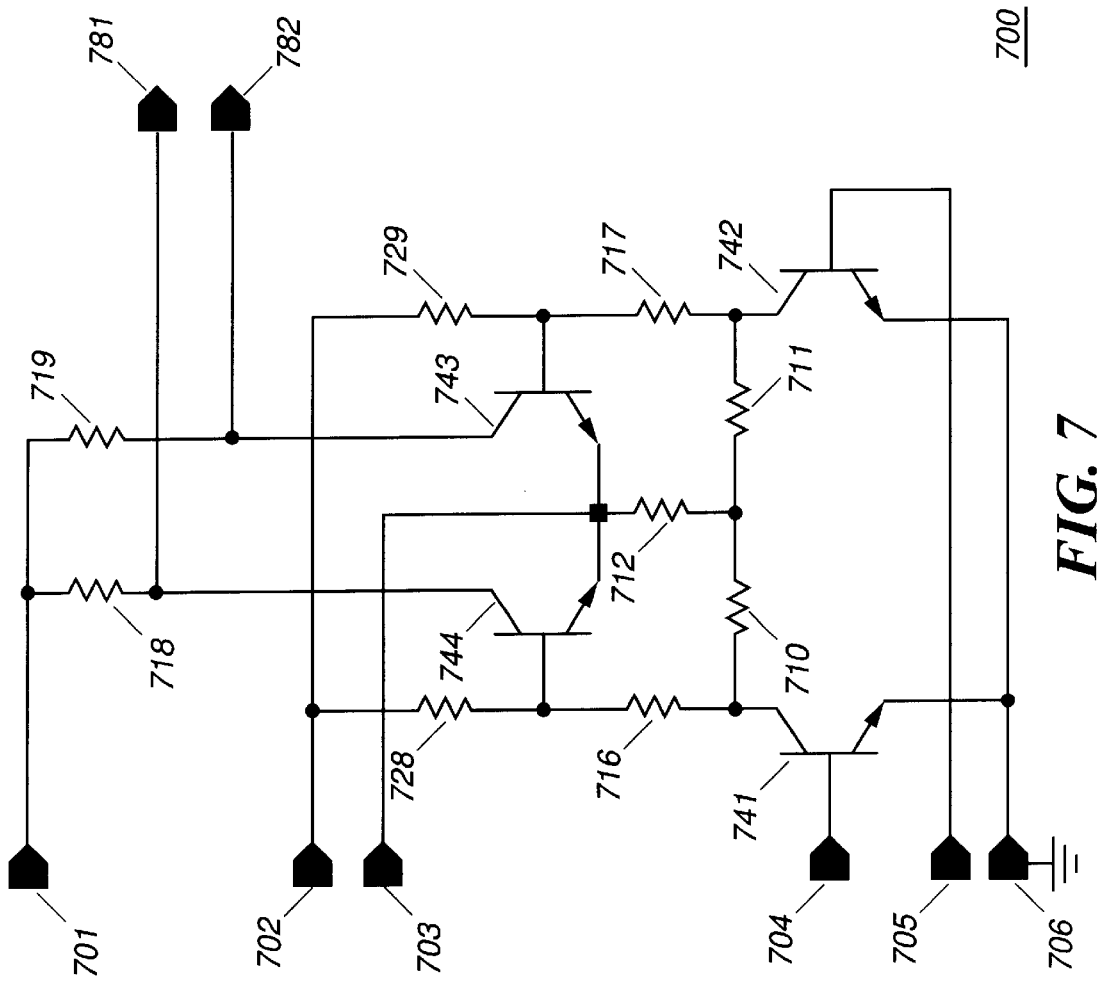
FIG. 7 is a detailed schematic diagram of a signal imbalance suppressor, in accordance with the present invention.

FIG. 7 shows a detailed schematic diagram 700 of a signal imbalance suppressor, in accordance with the present invention. Here, transistors 741, 742 form the amplifiers stage, resistors 710, 711 form the differential suppressor, or the common mode detector, and transistors 743, 744 perform the summing or combining function. Differential input terminals 704, 705 are coupled to the bases of the transistors 741, 742, and differential output terminals 781, 782 are coupled to the collectors of transistors 744, 743. Voltage supply lines 701, 702, and biasing line 703 provide the energy and biasing for the circuit.

Resistors 718, 719 are load resistors that provide a voltage swing for the differential output terminals 781, 782. Resistors 712 function as a common mode emitter degeneration for transistors 744, 743 that helps in linearization and input voltage swing. Resistors 710, 711 form the common mode detection circuitry. The resistors 710, 711 have large values and are selected to have substantially equal resistance values, thereby providing a common mode signal at the center node between the resistors 710, 711. The large resistor values also help in avoiding loading of the transistors 741, 742. Transistors 741, 742 provide an amplifying function. Resistors 716, 717, 728, 729 function as load resistors to the amplifiers 741, 742. The resistors 728, 716 are split to help to provide biasing for transistor 744, and also help to split the signal for summing by transistor 744. The resistors 729, 717 provide a similar function with respect to transistor 743.

Thus, according to the invention, signal imbalance suppression circuitry is associated with a differential processing circuit to preprocess differential input signals destined for the differential processing circuit to remove amplitude and/or phase imbalances between signal components of the differential input signal to obtain a pure differential signal. The differential processing circuit uses the pure differential signal, and optionally, one or more other signals, to generate a differential output signal. In the preferred embodiment, signal imbalance suppression is performed by obtaining first and second signals representing the unbalanced differential signal and by suppressing the pure differential mode component of the first signal, while minimizing impact on the pure common mode component, to obtain a common mode signal. The common mode signal is combined with the second signal to cancel the pure common mode component of the second signal, and a balanced differential signal is obtained from the unbalanced differential signal and outputted.

The present invention provides significant advantages over the prior art. By recognizing that imbalances in a differential input signal can result in the generation of second order and other even order distortion, and by preprocessing the differential input signal to remove imbalances prior to differential processing, a significant source of even order distortion has been eliminated. As a result, circuits, such as direct conversion receivers, that are susceptible to such distortion effects can be implemented with reduced cost and complexity.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An apparatus, comprising a differential processing circuit responsive to an input signal with first and second signal components, and a signal imbalance suppressor that preprocesses the input signal, prior to input to the differential processing circuit, to remove amplitude and/or phase imbalances that exist between the first and second signal components, in order to reduce even order distortion generation within the differential processing circuit;
wherein:
the input signal has a pure common mode signal component and a pure differential mode signal component; and
the signal imbalance suppressor has a primary purpose to remove the pure common mode signal component from the input signal and to present the pure differential mode signal component of the input signal to the differential processing circuit.

2. The apparatus of claim 1, wherein the signal imbalance suppressor comprises:
a differential mode suppressor, coupled to the input signal, and responsive thereto to generate an output of a signal representing the pure common mode signal component; and
a combiner having inputs coupled to the output of the differential mode suppressor and to the input signal, and responsive thereto to generate an output of a balanced differential signal representing a difference between the input signal and the pure common mode signal component.

3. The apparatus of claim 2, wherein the differential mode suppressor comprises:
first and second input terminals coupled to the input signal;
first and second output terminals that are short circuited with each other; and
isolation circuitry coupling the first and second input terminals to the first and second output terminals, which isolation circuitry allow signals to propagate from the input terminals to the output terminals, but not vice versa.

4. The apparatus of claim 2, wherein the differential mode suppressor comprises:
first and second input terminals coupled to the input signal;
first and second amplifiers coupled to the first and second input terminals, respectively, and having first and second output terminals, respectively, which first and second output terminals are short circuited with each other; and
wherein the first and second amplifiers are responsive to the input signal, when presented at the first and second input terminals, to generate the pure common mode signal component at the first and second output terminals.

5. The apparatus of claim 2, wherein the differential mode suppressor comprises:
first and second input terminals coupled to the input signal;
first and second amplifiers coupled to the first input terminal, the first and second amplifiers having first and second outputs, respectively;
third and fourth amplifiers coupled to the second input terminal, the third and fourth amplifiers having third and fourth outputs, respectively;
wherein:
the first and third outputs are short circuited with each other to provide a first output terminal, and the second and fourth outputs are short circuited with each other to provide a second output terminal; and
the first, second, third, and fourth amplifiers are responsive to the input signal, when presented at the first and second input terminals, to generate the pure common mode signal component at the first and second output terminals.

6. The apparatus of claim 1, wherein the signal imbalance suppressor comprises:
first and second input terminals coupled to the input signal;
first and second resistors coupled in series between the first and second input terminals, the first and second resistors having a common node therebetween;
a first combiner having inputs coupled to the first input terminal and to the common node between the first and second resistors and having an output coupled to a first output terminal; and
a second combiner having inputs coupled to the second input terminal and to the common node between the first and second resistors and having an output coupled to a second output terminal.

7. A balun, comprising:

a differential input port comprising first and second terminals, wherein the first terminal is coupled to electrical ground; and a differential imbalance suppressor coupled to the first and second terminals, and having circuitry to remove any amplitude and/or phase imbalances that exist between input signals presented on the first and second terminals.

8. The balun of claim 7, further comprising:

first and second resistors coupled in series between the first and second input terminals, the first and second resistors having a common node therebetween;

a first combiner having inputs coupled to the first input terminal and to the common node between the first and second resistors and having an output coupled to a first output terminal; and a second combiner having inputs coupled to the second input terminal and to the common node between the first and second resistors and having an output coupled to a second output terminal.

9. The balun of claim 8, further comprising amplification circuitry having inputs coupled to the first and second terminals and having outputs coupled to the first and second resistors.

10. An apparatus, comprising:

a signal source that outputs an unbalanced differential signal, the unbalanced differential signal having a pure differential mode signal component and a pure common mode signal component;

a differential processing circuit having a differential input and a differential output; and a balancing circuit having an input coupled to the unbalanced differential signal and an output coupled to the input of the differential processing circuit, the balancing circuit having a primary purpose to remove the pure common mode signal component from the unbalanced differential signal and to present the pure differential mode signal component of the unbalanced differential signal to the differential processing circuit.

11. The apparatus of claim 10, wherein the differential processing circuit comprises a mixer.

12. The apparatus of claim 10, wherein the signal source comprises a balun.

13. The apparatus of claim 10, wherein the signal source comprises a transformer.

14. A method for balancing an unbalanced differential signal, comprising the steps of:

obtaining first and second signals each representing the unbalanced differential signal, and each having a pure differential mode component and a pure common mode component;

suppressing the pure differential mode component of the first signal while minimizing impact on the pure common mode component of the first signal to obtain a common mode signal;

combining the common mode signal with the second signal to cancel the pure common mode component of the second signal, thereby obtaining a balanced differential signal from the unbalanced differential signal; and outputting the balanced differential signal.

* * * * *